United States Patent [19]

Kagamihara et al.

[11] Patent Number: 4,989,756
[45] Date of Patent: Feb. 5, 1991

[54] DISPENSING APPARATUS

[75] Inventors: Mitsuru Kagamihara; Minoru Kawagishi; Nobuto Yamazaki, all of Tokyo, Japan

[73] Assignee: Kabushiki Kaisha Shinkawa, Tokyo, Japan

[21] Appl. No.: 306,346

[22] Filed: Feb. 3, 1989

[51] Int. Cl.$^5$ ............................................. B67D 5/08
[52] U.S. Cl. ..................................... 222/55; 222/638; 425/146
[58] Field of Search ................... 222/52, 55, 57, 14, 222/638, 639, 644, 61, 649; 264/40.3, 40.7; 425/135, 146

[56] References Cited

U.S. PATENT DOCUMENTS 4,580,698 4/1986 Ladt et al. .............................. 222/55
4,613,059 9/1986 Merkel .................................. 222/55
4,830,219 5/1989 Siemann ............................... 222/55

Primary Examiner—H. Grant Skaggs
Assistant Examiner—Kenneth Noland
Attorney, Agent, or Firm—Koda and Androlia

[57] ABSTRACT

A paste-dispensing apparatus for bonding machines, etc., which constantly dispenses a fixed amount of paste, glue, etc. regardless of the amount remaining in a syringe and detects the amount of paste remaining in the syringe, including an air supply which supplies air under positive pressure to the syringe, a dispensing valve installed between the syringe and the air supply and connected to the syringe via a first pipe and to the air supply via a second pipe so that the syringe and the air supply communicate with each other when the paste is discharged, a first pressure sensor which measures the pressure inside the first pipe, a second pressure sensor which measures the pressure inside the second pipe, and a controller. Pressure values measured by the first and second pressure sensors are supplied to the controller so that the controller outputs a signal which actuates the dispensing valve so that the first and second pipes communiate when the paste is discharged. The controller further controls the time for outputting the signal in accordance with the difference in the time required for the pressure measured by the first pressure sensor to reach a preset pressure level after the first and second pipes have communicated with each other.

3 Claims, 2 Drawing Sheets

DISPENSING APPARATUS

BACKGROUND OF THE INVENTION

1. Field of the Invention

The present invention relates to a dispensing apparatus for paste or other types of adhesive agents, etc.

2. Prior Art

In die bonding apparatuses, for example, a fixed amount of bonding materials such as paste is dispensed onto a lead frame circuit board, etc., and the die is bonded on top of the dispensed paste. The paste is dispensed by supplying air under positive pressure to a syringe filled with paste.

Conventionally, the supply of air to the syringe is controlled by opening a dispensing electromagnetic valve, which is provided between the syringe and the positive-pressure air supply source, for a preset period of time. However, since the dispensing electromagnetic valve is controlled for a preset time period, several problems arise.

First, when a given air pressure is applied to the syringe for a fixed period of time, the amount of paste dispensed varies in accordance with the amount of paste remaining in the syringe. If the paste is opaque or if the paste is transparent and the syringe is opaque, the operator has no way of directly knowing the amount of paste remaining inside the syringe. In such cases, the amount of paste remaining in the syringe is ascertained indirectly from the amount of paste squeezed out from the side surfaces of the die by the die bonding operation after the paste has been dispensed onto the lead frame, etc. With such an ascertained value, the operator resets the time and air pressure.

Another problem arises in that since the paste and syringe are usually opaque, and the operator does not know the amount of paste remaining in the syringe. Furthermore, since the die bonding apparatus is automated and it runs without the presence of an operator, the apparatus may inadvertently run with no paste in the syringe, resulting in improper paste dispensing (no paste being dispensed) which leads to improper die bonding in the subsequent die bonding process. In addition, small amounts of paste may drip from the tip of the syringe when the apparatus is stopped.

SUMMARY OF THE INVENTION

Accordingly, one object of the present invention is to provide an apparatus for dispensing bonding materials such as paste, adhesive agents, etc. which constantly dispenses a fixed amount of the bonding materials (hereinafter merely called "paste") regardless of the amount of paste remaining in a syringe.

Another object of the present invention is to provide a paste-dispensing apparatus which can detect the amount of paste remaining in the syringe.

Still another object of the present invention is to provide a paste-dispensing apparatus wherein paste does not drip from the syringe after a fixed amount of paste has been dispensed.

The abovementioned objects are accomplished by the unique structure of the present invention which is equipped with a syringe which contains paste, an air supply source which supplies air under positive pressure to the syringe, a dispensing electromagnetic valve provided between the syringe and the air supply source, the dispensing electromagnetic valve being connected to the syringe via a first pipe and to the air supply source via a second pipe so that the syringe and the air supply source communicate with each other when the paste is dispensed. The apparatus of this invention further includes a first pressure sensor which measures the pressure inside the first pipe, a second pressure sensor which measures the pressure inside the second pipe, and a control section. The pressure measured by the first and second pressure sensors are supplied to the control section, and the control section outputs a voltage signal which actuates the dispensing electromagnetic valve so that the first and second pipes communicate with each other when the paste dispensing is initiated. The control section also controls the time required to output the voltage signal in accordance with the difference in the time required by the changes in the pressure measured by the first pressure sensor to reach a preset pressure after the first and second pipes have communicated with each other.

With the above described structure, the voltage signal is output from the control section when the paste is dispensed. This signal actuates the dispensing electromagnetic valve so that air under positive pressure is supplied to the syringe from the air supply source and the paste is dispensed from the syringe.

Variations in the rise of the pressure measured by the first pressure sensor in relation to the amount of paste remaining in the syringe is ascertained by the control section, and the time required for the dispensing electromagnetic valve to be driven, i.e. the dispensing time, is accordingly controlled by the control section (specifically, the output time of the voltage signal output by the control section) so that a fixed amount of paste is constantly dispensed even the amount of paste remaining in the syringe changes.

DETAILED DESCRIPTION OF THE INVENTION

Figure 1:
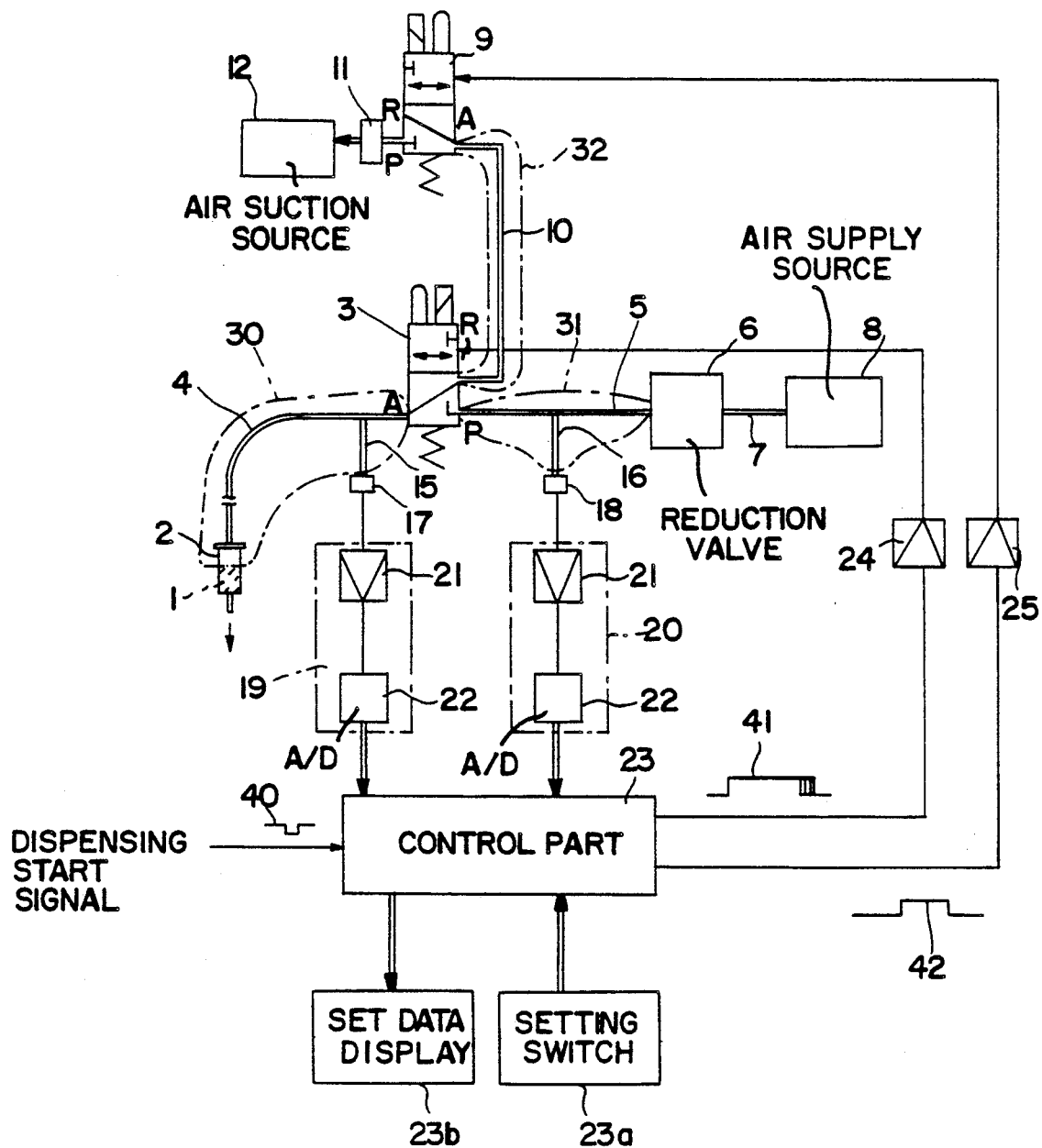
FIG. 1 is a front view of one embodiment of the apparatus according to the present invention.

Below one embodiment of the present invention will be first described with reference to FIG. 1.

A syringe 2 filled with a paste 1 is connected via a pipe 4 to one connecting port A of a dispensing electromagnetic valve 3 which has three connecting ports A, P and R. This dispensing electromagnetic valve 3 is designed such that the connecting ports A and R communicate with each other when the voltage is "off" (normal state), and the connecting ports A and P communicate with each other when the voltage is "on."

The connecting port P of the dispensing electromagnetic valve 3 is connected to a pressure reduction valve 6 via a pipe 5, and this pressure reduction valve 6 is further connected to a positive-pressure air supply source 8 via a pipe 7.

The connecting port R of the dispensing electromagnetic valve 3 is connected via a pipe 10 to a connecting port A of a suction electromagnetic valve 9 which has three connecting ports A, P and R. The connecting port P of this suction electromagnetic valve 9 is connected to a negative pressure air suction source 12 through a surge tank 11, and the connecting port R of the suction electromagnetic valve 9 is closed off. The suction electromagnetic valve 9 is designed such that the connecting ports A and R communicate with each other when the voltage is "off" (normal state), and the connecting ports A and P communicate with each other when the voltage is "on."

Pressure sensors 17 and 18 are connected to the pipes 4 and 5 via pipes 15 and 16, respectively. The pressures detected by these pressure sensors 17 and 18 are converted into electrical signals by the pressure sensors 17 and 18 and input into respective converter circuits 19 and 20. Each of these converter circuits 19 and 20 has an amplifying circuit 21 which amplifies extremely weak output signals detected by the corresponding pressure sensors 17 and 18 and correct any dispersion of the output signal of the sensors 17 and 18. The converter circuits 19 and 20, respectively, include an A/D converter 22 which converts a pressure analog signal into a binarized digital signal consisting of a plurality of binary numbers. The output of the converter circuits 19 and 20 are input in a control section 23 of a microprocessor (a single-chip computer, etc).

In order to simplify the description of the present invention, the space above the paste 1 inside the syringe 2 and the inner spaces of the pipes 4 and 15, will be referred to collectively as the "space 30." On the same token, the inner spaces of the pipes 5 and 16 will collectively be referred to the "space 31", and the inner space of the pipe 10 will be referred to as the "space 32."

The control section 23 outputs a voltage signal 41 when a dispensing start signal 40 is input. This voltage signal 41 is amplified by an amplifying circuit 24 and input into the dispensing electromagnetic valve 3. When dispensing is completed, the control section 23 outputs a voltage signal 42. This voltage signal 42 is amplified by an amplifying circuit 25 and input into the suction electromagnetic valve 9.

A set switch 23a for setting times, conditions, etc., and a set data display 23b are provided in the control section 23. The set switch 23a includes a switch for setting the time required for the dispensing electromagnetic valve 3 to be opened in order to dispense a required amount of paste 1, a switch for setting numerical values so as to reduce the dispensing time according to variations in the pressure rise time inside the space 30 which occur when the amount of paste 1 remaining in the syringe changes, a switch for setting the time required for the suction electromagnetic valve 9 to be kept opened immediately following dispensing action, and a switch for setting the value of the negative pressure ordinarily maintained inside the space 30. The set data display 23b displays data regarding the time and conditions set by means of the setting switch 23a, as well as the pressure detected in the spaces 30 and 31 by the pressure sensors 17 and 18.

Operation of the above described apparatus will be described below:

Inside the dispensing electromagnetic valve 3 and suction electromagnetic valve 9, the respective connecting ports A and R communicate with each other under ordinary conditions. Accordingly, the pressure inside the space 30 is maintained at the same level as the pressure inside the space 32. The pressure inside the space 31 is maintained at a level obtained by adjusting the positive-pressure air from the air supply source 8 to an appropriate pressure by means of the pressure reduction valve 6.

The pressure inside the space 30 is detected and converted into an electrical signal by the pressure sensor 17, and this electrical signal is input into the converter circuit 19. In the converter circuit 19, the output signal from the pressure sensor 17 is amplified by the amplifying circuit 21 and converted into a digital signal by the A/D converter 22. This digital signal is then input in the control section 23, and the control section 23 displays the signal from the converter circuit 19 on the set data display 23b.

Likewise, the pressure inside the space 31 is detected and converted into an electrical signal by the pressure sensor 18, and this electrical signal is amplified and converted into a digital signal by the converter circuit 20. The thus converted digital signal is then input into the control section 23. The control part 23 displays the signal from the converter circuit 20 on the set data display 23b and outputs a signal which controls the pressure reduction valve 6 so that the pressure inside the space 31 is maintained at a predetermined constant level.

Under these condition, if a signal 40 to start dispensing is input in the control section 23, the voltage signal 41 is output from the control section 23. This voltage signal 41 is amplified by the amplifying circuit 24 and is input into the dispensing electromagnetic valve 3. As a result, the connecting port A and connecting port P of the dispensing electromagnetic valve 3 communicate with each other so that the pipes 4 and 5 also communicate with each other and the pressure inside the space 31 is applied to the space 30. When positive pressure air is fed to the syringe 2, dispensing of the paste 1 is initiated.

The time required for the pressure inside the space 30 (i.e., the pressure detected by the pressure sensor 17) to become the same as the pressure inside the space 31 (i.e., the pressure detected by the pressure sensor 18) varies according to the amount of the paste 1 remaining in the syringe 2. This relationship is illustrated in FIG. 2.

Figure 2:
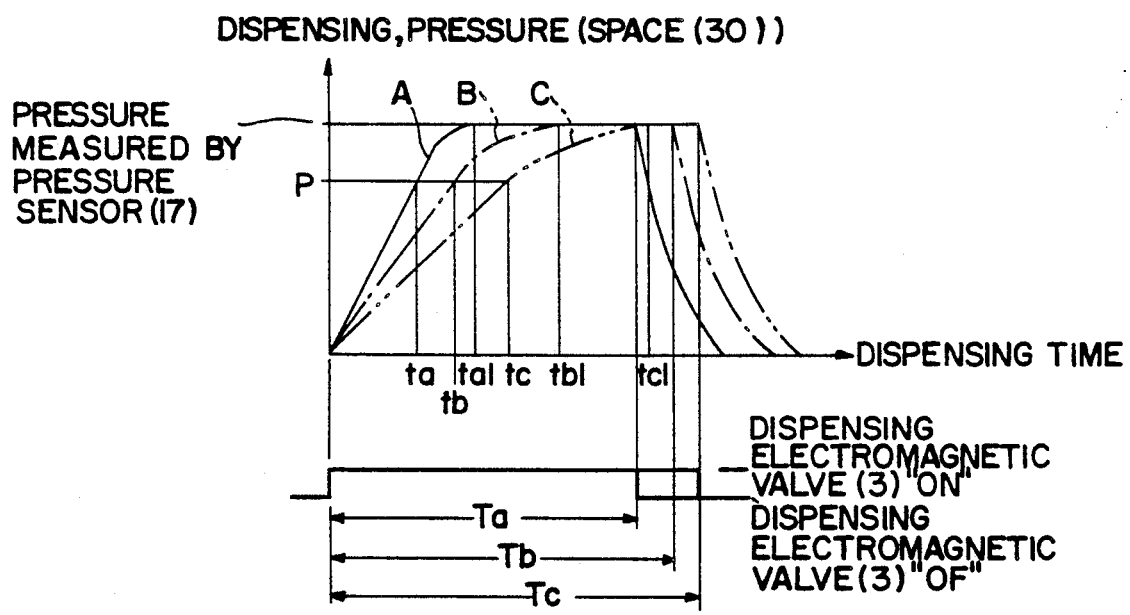
FIG. 2 is a graph which illustrates the relationship between the dispensing pressure and valve driving time.

In FIG. 2, curve A indicates the pressure measured by the pressure sensor 17 when the syringe 2 is completely filled with paste 1. Curve B indicates the pressure measured by the pressure sensor 17 when the amount of paste 1 in the syringe 2 is less than that shown by the curve A. Curve C indicates the pressure measured by the pressure sensor 17 when the amount of paste 1 in the syringe 2 is still less (by a given quantity) than that shown by the curve B. Furthermore, $ta_1$, $tb_1$ and $tc_1$ indicate respective times at which the pressure measured by the pressure sensor 17 in the curves A, B and C become equal to the pressure measured by the pressure sensor 18. Moreover, Ta, Tb and Tc indicate the respective time spans for which the voltage signal 41 applied to the dispensing electromagnetic valve 3 is left "on" (i.e., the respective dispensing time period) in the curves A, B and C.

As is clear from FIG. 2, the time span required for the pressure inside the space 30 to become equal to the pressure inside the space 31 becomes longer as the amount of paste 1 remaining in the syringe 2 decreases. Accordingly, the amount of the paste 1 remaining in the syringe 2 can be determined by measuring, by the control section 23, the time required for the pressure inside the space 30 (i.e., the pressure measured by the pressure sensor 17) and the pressure inside the space 31 (i.e., the pressure measured by the pressure sensor 18) to become equal after the voltage signal 41 has been output.

Accordingly, the relationship between the amount of paste 1 remaining in the syringe 2 and the time required for the pressure measured by the pressure sensor 17 to reach the pressure measured by the pressure sensor 18 is studied beforehand, and this relationship is stored in the control section 23. More specifically, by setting a certain time period as a value indicating that the amount of paste 1 remaining in the syringe 2 has been reduced to an amount such that replacement of the syringe 2 is necessary, and arranging for a display or warning to be generated on the set data display 23b when the replacement time coincides with the time required for the pressure measured by the pressure sensor 17 to reach the pressure measured by the pressure sensor 18, it become easy to ascertain when it is necessary to replace the syringe 2.

Furthermore, the respective times for which the voltage signal 41 applied to the dispensing electromagnetic valve 3 is left "on," i.e., the respective dispensing times Ta, Tb and Tc are set as follows: The respective times at which the curves A, B and C reach (in a linear state) a certain arbitrary pressure P as measured by the pressure sensor 17 are labeled "ta", "tb" and "tc." The dispensing time Ta which causes a certain fixed amount of paste 1 to be dispensed from the syringe 2 in the case of the curve A is determined by experiment, and the dispensing times Tb and Tc for curves B and C are determined using the following formulae:

$$Tb = Ta + n(tb - ta)$$

$$Tc = Ta + n(tc - ta)$$

The above formulae can be rewritten as the following general formula:

$$T = Ta + n(t - ta)$$

wherein, n is a constant which is determined by the viscosity of the paste 1, the lengths and internal diameters of the pipes 4 and 15 and the size of the syringe 2, etc. The numerical value of this constant n can be determined by experiment. In the above formulae, Ta is used as a standard; however, it would also be possible to use Tb or Tc as a standard.

Thus, by storing the relationship between the amount of paste 1 remaining in the syringe 2 and the abovementioned formulae in the control section 23 beforehand, and using the control section 23 to control the time T (Ta, Tb and Tc) for which the voltage signal 41 is applied to the dispensing electromagnetic valve 3 in accordance with the amount of paste 1 remaining in the syringe 2, it is possible to insure that a predetermined fixed amount of paste 1 is always dispensed from the syringe 2.

When the voltage signal 41 is switched "off," the dispensing electromagnetic valve 3 is "off" so that the connecting ports A and R in the dispensing electromagnetic valve 3 communicate with each other; thus, the space 30 is connected with the space 32, the pressure inside the syringe 2 drops, and the dispensing of paste 1 from the syringe 2 is completed.

Simultaneously or immediately prior to the switching off of the dispensing electromagnetic valve 3, the voltage signal 42 is output from the control section 23. This voltage signal 42 is amplified by the amplifying circuit 25 and input into the suction electromagnetic valve 9. As a result, the connecting ports A and P of the suction electromagnetic valve 9 communicate with each other, and the space 32 is placed under negative pressure by the air suction source 12.

Accordingly, when dispensing of the paste 1 is completed, and the spaces 30 and 32 are connected as described above, the space 30 is placed under negative pressure. The negative pressure in the space 30 is measured by the pressure sensor 17, and when this measured negative pressure reaches a constant value, the voltage signal 42 is switched "off." When the voltage signal 42 is switched "off," the connecting ports A and R of the suction electromagnetic valve 9 communicate with each other.

Thus, since the space 30 is placed under constant negative pressure after dispensing of the paste 1 is completed, dripping of paste 1 from the tip of the syringe 2 is prevented. In this case, if the negative pressure from the air suction source 12 is supplied to the suction electromagnetic valve 9 via the surge tank 11 as in this embodiment, the negative pressure does not fluctuate. Accordingly, stable negative pressure can be supplied to the space 30 when the connecting port A communicates with the connecting port R, and the mechanism used to prevent dripping of the paste 1 can act with greater precision.

If the space 30 is completely sealed off, dripping of paste 1 is prevented by means of the above described action alone. However, pressure leakage from the space 30 can occur due to the dispensing electromagnetic valve 3. If this does occur under these conditions, the space 30 returns to atmospheric pressure after a given period of time. As a result, the paste 1 drips from the tip of the syringe 2 due to gravity. Thus, when the pressure measured by the pressure sensor 17 is closer to the atmospheric pressure than the preset negative pressure required in the space 30, the voltage signal 42 is again output from the control section 23. As a result, the connecting ports A and P of the suction electromagnetic valve 9 again communicate with each other in the manner described above. In this way, the system is controlled so that constant negative pressure is maintained in the space 30.

As mentioned in detail in the above, variations in the rise of pressure measured by the pressure sensor 17 which occur in accordance with the amount of paste 1 remaining in the syringe 2 are ascertained by the control section 23, and the control section 23 accordingly outputs a voltage signal 41 so that the time required for the dispensing electromagnetic valve 3 to be driven (i.e., the dispensing time) is lengthened as the amount of paste 1 remaining in the syringe 2 becomes smaller. Accordingly, a fixed amount of paste 1 is always dispensed regardless of the amount of paste 1 remaining in the syringe 2.

Furthermore, the amount of paste 1 remaining in the syringe 2 is ascertained as a result of the control section 23 evaluating the time required for the pressure measured by the pressure sensor 17 to reach a fixed pressure. Accordingly, improper dispensing can be prevented, and the syringe 2 can be replaced more efficiently. In addition, since air under a negative pressure is supplied to the syringe 2 from the air suction source 12 at all times when the paste 1 is not being dispensed, dripping of the paste from the tip of the syringe can be prevented.

In the above embodiment, a suction electromagnetic valve 9 is used. However, even if the suction electromagnetic valve 9 is not used, a constant negative pressure can be maintained in the pipe 10 by connecting the air suction source 12 directly to the pipe 10.

As is clear from the above description, according to the present invention, a fixed amount of paste can be constantly dispensed regardless of the amount of paste remaining in the syringe. Furthermore, the amount of paste remaining in the syringe can be ascertained, improper dispensing can be prevented, and replacement of the syringe can be performed more efficiently. Moreover, the dripping of the paste from the tip of the syringe is prevented.

We claim:

1. A paste-dispensing apparatus comprising:
   a syringe which holds paste therein;
   an air supply source which supplies air under a positive pressure to said syringe;
   a dispensing electromagnetic valve provided between said syringe and air supply source, said valve being connected to said syringe via a first pipe and to said air supply source via a second pipe so that said syringe and air supply source communicate with each other when paste is dispensed;
   a first pressure sensor which measures the pressure inside of said first pipe;
   a second pressure sensor which measures the pressure inside of said second pipe; and
   a control section wherein pressures measured by said first and second pressure sensors are input, said control section outputting a voltage signal that actuates said dispensing electromagnetic valve so that said first and second pipes communicate with each other when the dispensing of paste is initiated, said control section further providing a means for controlling an output time of said voltage signal in accordance with changes in the time required for the pressure measured by said first pressure sensor to reach a preset pressure after said first and second pipes have been connected.

2. A paste-dispensing apparatus comprising:
   a syringe which holds paste therein;
   an air supply source which supplies air under a positive pressure to said syringe;
   a dispensing electromagnetic valve provided between said syringe and air supply source, said valve being connected to said syringe via a first pipe and to said air supply source via a second pipe so that said syringe and air supply source communicate with each other when paste is dispensed;
   an air suction source connected to said dispensing electromagnetic valve via a third pipe so that said air suction source communicates with said first pipe when said first pipe and second pipe do not communicate with each other, said air suction source supplying air under negative pressure;
   a first pressure sensor which measures the pressure inside of said first pipe;
   a second pressure sensor which measures the pressure inside of said second pipe; and
   a control section wherein pressures measured by said first and second pressure sensors are input, said control section outputting a voltage signal that actuates said dispensing electromagnetic valve so that said first and second pipes communicate with each other when the dispensing of paste is initiated, and said control section further controlling an output time of said voltage signal in accordance with changes in the time required for the pressure measured by said first pressure sensor to reach a preset pressure after said first and second pipes have communicated.

3. A paste-dispensing apparatus comprising:
   a syringe which holds paste therein;
   an air supply source which supplies air under a positive pressure to said syringe;
   a dispensing electromagnetic valve provided between said syringe and air supply source, said valve being connected to said syringe via a first pipe and to said air supply source via a second pipe so that said syringe and air supply source communicate with each other when paste is dispensed;
   a suction electromagnetic valve connected to said dispensing electromagnetic valve via a third pipe so that said suction electromagnetic valve communicates with said first pipe when said first pipe and second pipe do not communicate with each other;
   an air suction source connected to said suction electromagnetic valve, said air suction source supplying air under a negative pressure to said third pipe;
   a first pressure sensor which measures the pressure inside of said first pipe;
   a second pressure sensor which measures the pressure inside of said second pipe; and
   a control section wherein pressures measured by said first and second pressure sensors are input, said control section outputting a voltage signal that actuates said dispensing electromagnetic valve so that said first and second pipes communicate with each other when dispensing of paste is initiated, controlling an output time of said voltage signal in accordance with changes in the time required for the pressure measured by said first pressure sensor to reach a preset pressure after said first and second pipes have communicated with each other, and outputting a voltage signal to said suction electromagnetic valve so that said third pipe and air suction source communicate with each other simultaneously or immediately prior to said first pipe communicates with said second pipe.

* * * * *